US012610686B2

(12) United States Patent
Lee et al.

(10) Patent No.: US 12,610,686 B2
(45) Date of Patent: Apr. 21, 2026

(54) ARRAY SUBSTRATE WITH CONCAVO-CONVEX STRUCTURE, DISPLAY PANEL, DISPLAY DEVICE AND MANUFACTURING METHOD OF ARRAY SUBSTRATE

(71) Applicant: HKC CORPORATION LIMITED, Shenzhen (CN)

(72) Inventors: Won Kyu Lee, Shenzhen (CN); Jeoung Kwen Noh, Shenzhen (CN); Haijiang Yuan, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 853 days.

(21) Appl. No.: 17/877,738

(22) Filed: Jul. 29, 2022

(65) Prior Publication Data

US 2023/0035525 A1      Feb. 2, 2023

(30) Foreign Application Priority Data

Jul. 30, 2021      (CN) .......................... 202110876082.6

(51) Int. Cl.
*H10K 59/12* (2023.01)
*H10K 50/84* (2023.01)
*H10K 71/00* (2023.01)

(52) U.S. Cl.
CPC ............. *H10K 59/12* (2023.02); *H10K 50/84* (2023.02); *H10K 71/00* (2023.02); *H10K 59/1201* (2023.02)

(58) Field of Classification Search
CPC .... H10K 59/12; H10K 59/1201; H10K 50/84; H10K 71/00

(Continued)

(56) References Cited

U.S. PATENT DOCUMENTS

2008/0081105 A1*    4/2008    Suh ......................... H05B 33/14
                                                                    427/58
2010/0059754 A1*    3/2010    Lee ......................... H10K 59/38
                                                                    257/40

(Continued)

FOREIGN PATENT DOCUMENTS

CN              1529915 A        9/2004
CN          104460118 A          3/2015

(Continued)

OTHER PUBLICATIONS

First Office Action issued in counterpart Chinese Patent Application No. 202110876082.6, dated Jan. 24, 2022.

(Continued)

*Primary Examiner* — Eric W Jones
(74) *Attorney, Agent, or Firm* — Westbridge IP LLC

(57)      ABSTRACT

Disclosed are an array substrate, a display panel, a display device, and a manufacturing method of the array substrate. The array substrate includes a substrate layer, a passivation layer and a filter layer sequentially stacked. A side of the passivation layer facing the filter layer is provided with a concave-convex structure. By setting the concave-convex structure, when the light rays hit the uneven structure, the passivation layer region of the concave-convex structure can function as a lens. According to the principle of light scattering, light is scattered or diffused in the concave-convex structure to increase the propagation paths of light, more light can pass through the passivation layer and the light transmittance is improved. According to the principle of light diffraction, a new light source is formed at the position of the concave-convex structure to increase the light density and the light transmittance is improved.

8 Claims, 7 Drawing Sheets

10

(58) Field of Classification Search
USPC ............................................ 257/40, 59, 99
See application file for complete search history.

(56) References Cited

U.S. PATENT DOCUMENTS

| | | | | |
|---|---|---|---|---|
| 2015/0036213 A1* | 2/2015 | Chung | ................. | G02B 3/0056 |
| | | | | 359/463 |
| 2015/0091786 A1* | 4/2015 | Yang | .................. | H10K 59/1213 |
| | | | | 345/80 |
| 2015/0185398 A1* | 7/2015 | Chang | ................. | G02B 6/0063 |
| | | | | 362/619 |
| 2016/0155983 A1* | 6/2016 | Lee | .................... | H10K 59/8791 |
| | | | | 257/40 |
| 2018/0122883 A1* | 5/2018 | Beak | ..................... | H10K 59/123 |
| 2020/0083309 A1* | 3/2020 | Wang | ................. | H10D 30/6723 |
| 2021/0359252 A1* | 11/2021 | Wang | ................. | H10K 50/8426 |
| 2022/0102432 A1* | 3/2022 | Xie | ...................... | H10K 59/877 |

FOREIGN PATENT DOCUMENTS

| | | | | |
|---|---|---|---|---|
| CN | 104733456 A | 6/2015 | | |
| CN | 110120466 A | 8/2019 | | |
| GB | 2361356 A | * 10/2001 | ............. | H10K 50/85 |

OTHER PUBLICATIONS

Notification to Grant Patent Right for Invention issued in counter-part Chinese Patent Application No. 202110876082.6, dated Apr. 29, 2022.

* cited by examiner

312

32

312

32

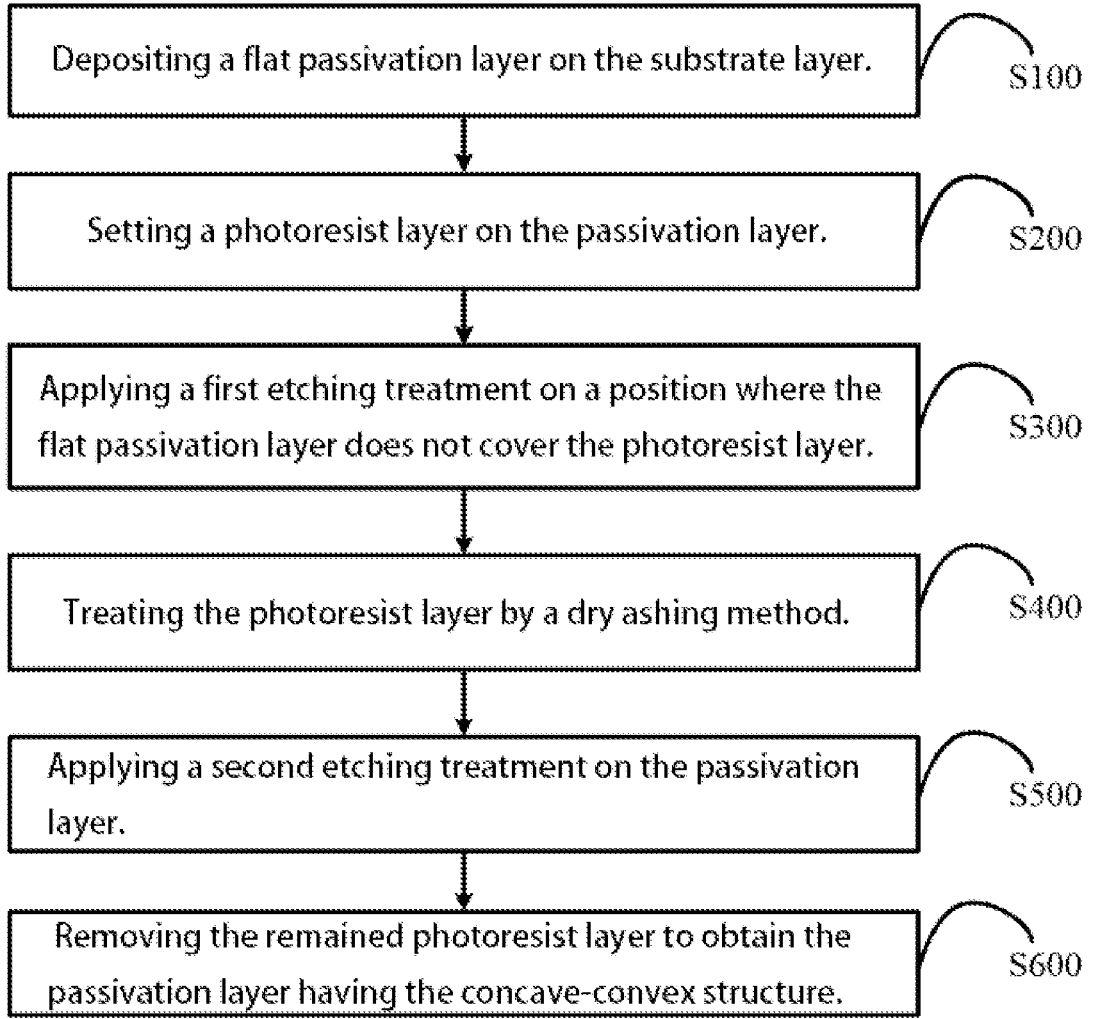

Depositing a flat passivation layer on the substrate layer.

S100

Setting a photoresist layer on the passivation layer.

S200

Applying a first etching treatment on a position where the flat passivation layer does not cover the photoresist layer.

S300

Treating the photoresist layer by a dry ashing method.

S400

Applying a second etching treatment on the passivation layer.

S500

Removing the remained photoresist layer to obtain the passivation layer having the concave-convex structure.

ARRAY SUBSTRATE WITH CONCAVO-CONVEX STRUCTURE, DISPLAY PANEL, DISPLAY DEVICE AND MANUFACTURING METHOD OF ARRAY SUBSTRATE

CROSS-REFERENCES TO RELATED APPLICATIONS

The present disclosure claims priority to Chinese Patent Application No. 202110876082.6, entitled "ARRAY SUB-STRATE, DISPLAY PANEL, DISPLAY DEVICE AND MANUFACTURING METHOD OF ARRAY SUB-STRATE", filed on Jul. 30, 2021, which is incorporated herein as a reference in its entirety.

TECHNICAL FIELD

The present application relates to the field of display panels, in particular to an array substrate, a display panel, a display device and an array substrate manufacturing method.

BACKGROUND

In the related art, when the light emitted from the organic light-emitting diode (OLED) light emitting layer of the OLED of the bottom light emitting structure is emitted from the back plate, the light cannot pass through the metal layer and the region where the transistors locate, and the light can only be transmitted from the transparent region, and the light transmission of the array substrate with vertical arrangement is significantly lower. Generally, the light transmittance of this structure is difficult to reach more than 30%. Thus, it is difficult to develop products with high brightness and high resolution.

Therefore, it is necessary to provide a novel array substrate, a novel display panel, a novel display device and a novel manufacturing method of the array substrate, to solve or at least alleviate the above technical defects.

SUMMARY

The main purpose of the present application is to provide an array substrate, a display panel, a display device and a manufacturing method of the array substrate, and to solve the technical problem of low light transmittance of the array substrate in the related art.

To realize the purpose above, the present application provides an array substrate, including a substrate layer, a passivation layer and a filter layer sequentially stacked, wherein one side of the passivation layer facing the filter layer is provided with a concavo-convex structure.

Optionally, the concavo-convex structure is formed by a plurality of grooves spaced at a bottom of the passivation layer.

Optionally, a cross section of each groove forms a trapezoid, a length of a bottom edge of each groove is 0 μm to 2 μm, a distance between two adjacent grooves is 0 μm to 2 μm, and a height of each groove is less than one third of a maximum thickness of the passivation layer.

Optionally, an inclination angle of a hypotenuse of the trapezoid is 30~60 degrees.

Optionally, a cross section of each groove is in an inverted triangular shape.

Optionally, a cross section of each groove is in an arc shape.

To realize the purpose above, according to an aspect of the present application, the present application provides an array substrate, including a substrate layer, a passivation layer and a light filter layer sequentially stacked, the substrate layer includes a substrate and a thin film transistor layer, the thin film transistor layer is disposed on the substrate, the passivation layer covers the substrate and the thin film transistor layer, and the light filter layer is disposed on the passivation layer and is staggered from the thin film transistor layer, a side of the passivation layer facing the filter layer is provided with a concave-convex structure, Optionally, and the concave-convex structure is formed by a plurality of grooves arranged at intervals at a bottom of the passivation layer.

Optionally, a cross section of each groove forms a trapezoid, a length of a bottom edge of each groove is 0 μm to 2 μm, a distance between two adjacent grooves is 0 μm to 2 μm, and a height of each groove is less than one third of the maximum thickness of the passivation layer; the concavo-convex structure is configured to diffuse and diffract light rays incident on the passivation layer from the filter layer.

Optionally, an inclination angle of a hypotenuse of the trapezoid is 30 to 60 degrees.

Optionally, the groove structure is an inverted triangle shape.

Optionally, the cross section of the groove is arc-shaped.

In one embodiment, the present application further provides a display device, which includes a display panel and a backplane, and the display panel is disposed on the backplane.

In one embodiment, the present application further provides a manufacturing method of an array substrate, in particular the manufacturing method of the array substrate is configured for manufacturing the array substrate, optionally the manufacturing method of the array substrate includes:

depositing a flat passivation layer on a substrate layer;

setting a photoresist layer on the flat passivation layer;

etching a position of the flat passivation layer not covered by the photoresist layer for a first time;

dry-ashing the photoresist layer, and etching the passivation layer for a second time; and removing the photoresist layer to form a passivation layer with a concave-convex structure.

In the above technical solution of the present application, the array substrate includes a substrate layer, a passivation layer and a light filter layer which are sequentially stacked, and a side of the passivation layer facing the light filter layer is provided with a concave-convex structure. In the above solution, by setting the region of the passivation layer as the concave-convex structure, when the light rays hit an uneven structure, the passivation layer region of the concave-convex structure may function as a lens. According to the principle of light scattering, light will be scattered or diffused in the concave-convex part to increase the propagation path of light, so that more light can pass through the passivation layer, thereby improving the light transmittance; and, according to the principle of light diffraction, a new light source emission will be formed at the position of the concave-convex structure to increase the light density, thereby improving the light transmittance. The present application has an advantage of high light transmittance by providing a concave-convex structure in the light transmission area of the array substrate.

BRIEF DESCRIPTION OF THE DRAWINGS

In order to more clearly illustrate the embodiments of the present application or the technical solutions in the related art, the following will briefly introduce the drawings that are needed to be used in the description of the embodiments or the related art. Obviously, the drawings in the following description are only some embodiments of the present application. For those of ordinary skill in the art, without creative labor, other drawings can also be obtained according to the structure shown in these drawings.

FIG. 6 is a schematic flow chart of an embodiment of a method for manufacturing an array substrate in the present application.

Figure 1:
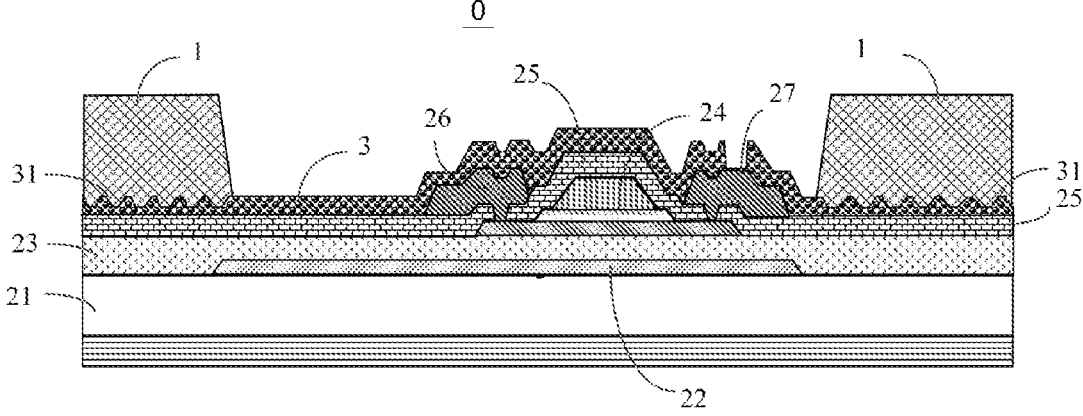
FIG. 1 is a schematic structural diagram of an array substrate according to an embodiment of the present application.

The realization, functional characteristics and advantages of the object of the present application will be further described with reference to the drawings in conjunction with the embodiments.

DETAILED DESCRIPTION OF THE EMBODIMENTS

The embodiments of the present application will be clearly and completely described below with reference to the accompanying drawings in the embodiments of the present application. Obviously, the described embodiments are only a part of the embodiments of the present application, rather than all of the embodiments. Based on the embodiments in the present application, all other embodiments obtained by those of ordinary skill in the art without making creative labor belong to the claimed scope of the present application.

It should be noted that all directivity indications (such as up, down, etc.) in the embodiments of the present application are only used to explain the relative positional relationship, movement situation, etc. between the components under a specific posture (as shown in the drawings), and if the specific posture changes, the directivity indication also changes accordingly.

In addition, the description in the present application as to "first," "second" and the like is for descriptive purposes only and cannot be understood as indicating or implying the relative importance thereof or implying the number of technical features indicated. Therefore, the features being defined "first" and "second" may explicitly or implicitly include at least one of the features.

In addition, the technical solutions between the various embodiments of the present application may be combined with each other, but they must be based on the implementation of those of ordinary skill in the art. When the combination of the technical solutions is contradictory or cannot be realized, it should be considered that the combination of such technical solutions does not exist and is not within the claimed scope of the present application.

Figure 3:
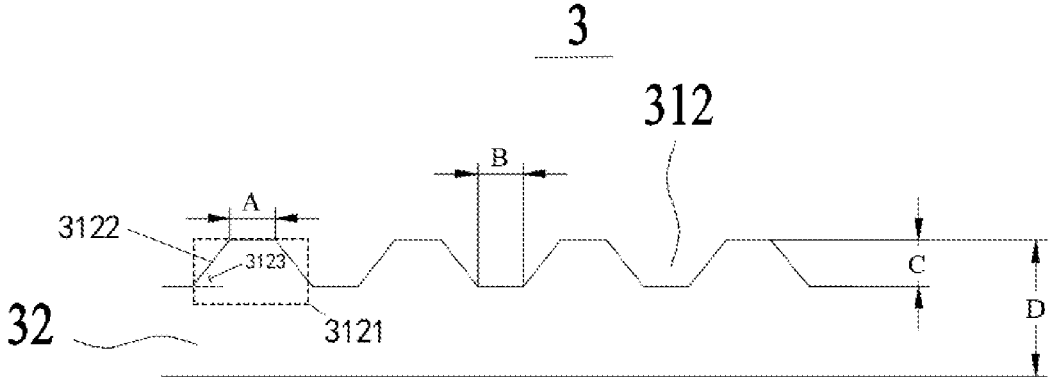
FIG. 3 is a schematic diagram of an embodiment of a concave-convex structure.

According to FIGS. 1 and 3, FIG. 1 is a schematic structural diagram of an array substrate 0 according to an embodiment of the present application. FIG. 3 is a schematic diagram of concave-convex structure 31 in an embodiment of the present application. According to one aspect of the present application, the present application provides an array substrate 0, including a substrate layer 2, a passivation layer 3 and a light filter layer 1 arranged in layers, the passivation layer 3 is arranged as concave-convex structure 31 on one side facing light filter layer 1.

In the present embodiment, the substrate layer 2 includes: a base 21 on which a light shield 22 and a buffer layer 23 are arranged; a thin film transistor (TFT) layer 24 arranged on the buffer layer 23, the thin film transistor layer 24 including an active layer, a gate insulating layer, a gate electrode, an in-between dielectric layer 25, a source electrode 26 and a drain electrode 27 arranged in a stacked manner. The passivation layer 3 covers the source electrode 26, the drain electrode 27 and the in-between dielectric layer 25, and a light filter layer 1 is disposed on both ends of the passivation layer 3 and facing an anode layer 41 of a display panel 10. In this embodiment, a region of the passivation layer 1 facing the light filter layer 1 is set as the concave-convex structure 31, and the passivation layer 3 with the concave-convex structure 31 can function as a lens when the light is irradiated on the uneven structure.

Figure 4:
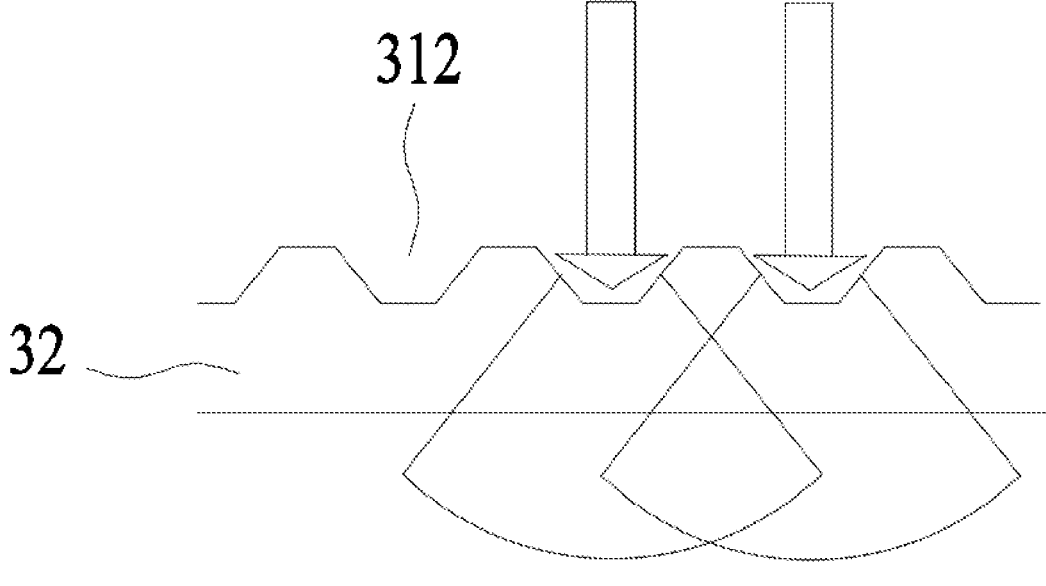
FIG. 4 is a diagram showing scattering of light through the concave-convex structure.
Figure 5:
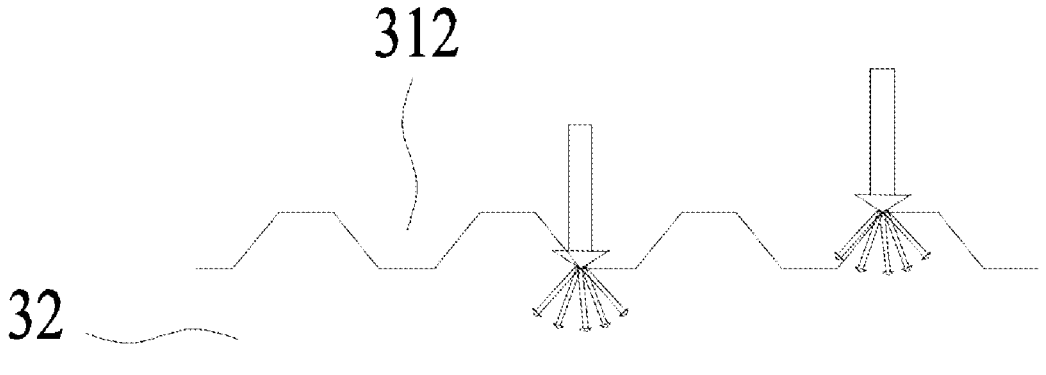
FIG. 5 is a diagram showing diffraction of light through the concave-convex structure.

According to FIG. 4, which is a schematic diagram showing scattering of light on the concave-convex structure according to the embodiment of the present application. According to the scattering principle of light, light will be scattered or diffused in the concave-convex structure 31 to increase the propagation paths of light, so that more light can pass through the passivation layer 3, thereby improving the light transmittance. According to FIG. 5, FIG. 5 is a schematic diagram showing diffraction of light on the concave-convex structure 31 according to the embodiment of the present application. According to the principle of light diffraction, a new light source is formed at an inflection point of the concave-convex structure 31 to emit, thereby increasing the density of light and improving the transmittance of light. In this embodiment, the passivation layer 3 is provided as a concave-convex structure 31, which has an advantage of high light transmittance. The passivation layer 3 may be made of silicon oxide or silicon nitride, and the passivation layer 3 may be disposed on the in-between medium of the substrate layer 2. In addition, the substrate layer includes a TFT transistor, a mask and a buffer layer. The light filter layer 1 may be a light filter. The light filter may be a blue filter, a red filter, a green filter, or the like, and the light filter may only allow light of a specific color to pass through.

Further, FIG. 3 is a schematic diagram of the concave-convex structure 31 according to the embodiment of the present application. The concave-convex structure 31 is formed by a plurality of grooves 312 provided at intervals at a bottom of the passivation layer 3. In particular, portions of the passivation layer 3 are recessed inward to form the plurality of parallel and spaced grooves 312. The recessed grooves 312 form concave structures, and a convex structures is formed between two adjacent grooves 312, thus the concave-convex structure 31 is formed on the passivation layer 3.

Further, according to FIG. 3, which is a schematic diagram of the concave-convex structure 31 according to the embodiment of the present application. A length of a bottom edge of a groove 312 is 0 μm to 2 μm, a distance between two adjacent grooves 312 is 0 μm to 2 μm, and a height of the groove 312 is less than one third of a maximum thickness of the passivation layer. In particular, the distance between two adjacent grooves 312 is shown in FIG. 3 as A, the length of the bottom edge of the groove 312 is shown in FIG. 3 as B, the height of the groove 312 is shown in FIG. 3 as C, and the maximum thickness of the passivation layer 3 is shown in FIG. 3 as D. A cross section of the groove 312 is trapezoidal with a bottom edge length smaller than a top edge length, thus the design is conducive to light entering the groove 312, and effectively improves the transmittance of light. Theoretically the smaller the size of the concave-convex structure 31, the better of the transmittance of light. A small-sized concavo-convex structure 31 can be obtained by providing a photoresist on the passivation layer 3, and then by two etching and a dry ashing method, so that the bottom edge length of the groove 312 and the distance between adjacent two grooves 312 are all less than 2 nm, and the height of the bump 311 is limited by a maximum value. The specific manufacturing method will be described in detail in the following manufacturing method of the array substrate, which will not be repeated here. In addition, the cross section of the groove 312 may be an isosceles trapezoidal 3121.

Further, an inclination angle 3123 of a hypotenuse 3122 of the trapezoid 3121 is 30 to 60 degrees. The experiment proves that the light diffusion effect is the best when the inclination angle is set to be 30 to 60 degrees.

Further, the cross section of the groove 312 may also be an inverted triangle. This design is beneficial to the refraction of light in the groove 312 and the diffraction at the edge position of the opening of the groove 312, thus improving the transmittance of light.

Further, the cross section of the groove 312 may also be arc-shaped. In order to facilitate the light to enter the groove 312, a central angle of the arc can be set to less than 180 degrees, which is more conducive to the diffusion of light and helpful to improve the transmittance of light.

Figure 2:
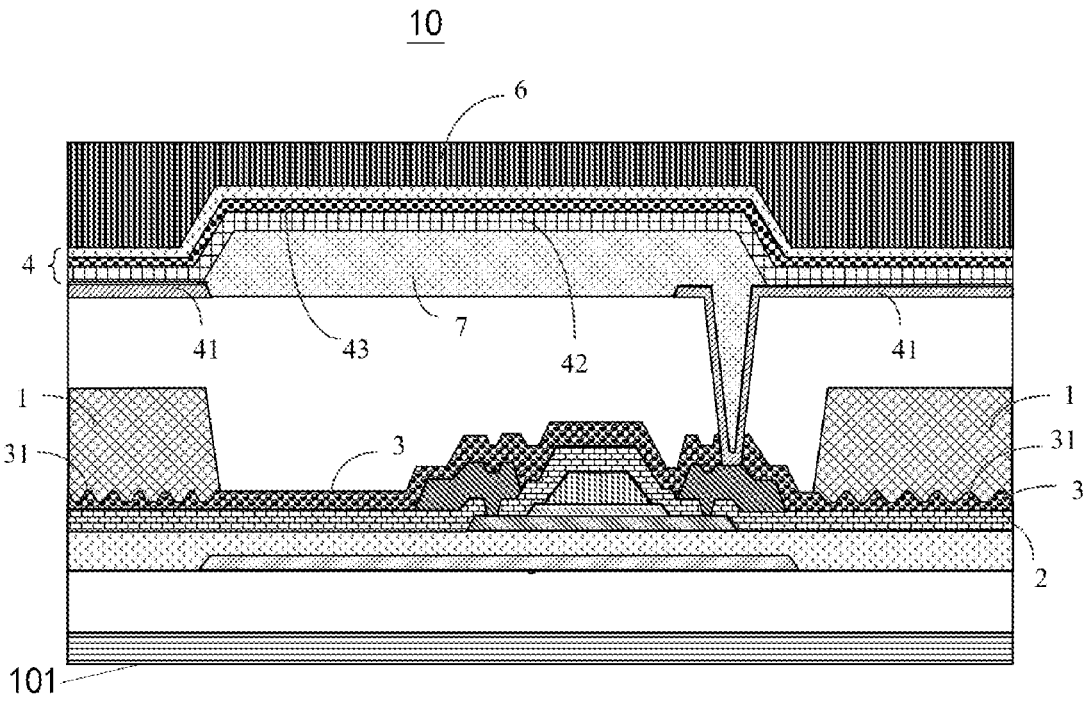
FIG. 2 is a schematic structural diagram of a display panel according to an embodiment of the present application.

According to another aspect of the present application, according to FIG. 2, which is a schematic structural diagram of a display panel 10 according to an embodiment of the present application. The display panel 10 includes an encapsulation layer 6 and an OLED light-emitting layer 4, and further includes the above array substrate. The OLED light-emitting layer 4 is disposed facing the array substrate, and the encapsulation layer 6 is disposed on a side of the OLED light-emitting layer 4 facing away from the array substrate. The OLED light-emitting layer 4 may include an anode layer 41, an OLED layer 42 and a cathode layer 43 that are sequentially stacked. The OLED layer 42 is disposed close to the anode layer 41 and emits light toward the anode layer 41. The anode layer 41 is disposed facing the passivation layer 3 and the anode layer 41 is disposed on both sides of the OLED layer 42, and a pixel defining layer (PDL) 7 is disposed in a middle part of the OLED layer 42. A planarization layer (OC layer) is also arranged between the pixel defining layer 7 and the passivation layer 3, and the cathode layer 43 is arranged close to the encapsulation layer 6. The OLED layer 42 is provided with a light-emitting element, and the light-emitting element may be an OLED lamp. The light emitted by the OLED lamp passes through the anode layer 41 and the light filter layer 1 and then emits to the concave-convex structure 31 of the passivation layer 3, so that the light transmittance of the display panel 10 can be improved by an action of the concave-convex structure 31, and a light utilization efficiency can be improved, thereby improving brightness and resolution of the display panel 10. In addition, the anode layer 41 includes a top surface close to the OLED layer 42 and a bottom surface facing the passivation layer 3, and both the top surface and the bottom surface are planar. In the related art, there is a technique by providing a concave-convex structure in the anode layer 41, but the concave-convex structure provided in the anode layer 41 is to increase the surface area of the anode layer 41. However, in this embodiment, in order to ensure the efficient transmission of light through the anode layer 41, the surface of the anode layer 41 should be arranged to be flat. At the same time, in the present application, the concave-convex structure 31 is arranged in the passivation layer 3 to increase the diffraction and scattering of light to improve transmittance of light. The position and purpose of the concave-convex structure 31 in the passivation layer 3 in the present application is not the same as those of the concave-convex structure in the anode layer 41 in the related art. At the same time, since the display panel 10 includes all the technical solutions of all the embodiments of the above-mentioned array substrate, it has at least all the beneficial effects brought by the above-mentioned embodiments, which will not be repeated here.

According to another aspect of the present application, the present application further provides a display device, which includes the above-mentioned display panel 10 and a backplane 101, and the display panel 10 is disposed on the backplane 101. The display device may be a product or a component having any display function, such as an electronic paper, a liquid crystal television, a liquid crystal display, a digital photo frame, a mobile phone, a tablet computer, or the like. Since the display device includes all the technical solutions of all the embodiments of the above-mentioned display panel 10, it has at least all beneficial effects brought by the above-mentioned embodiments, which will not be repeated here.

According to another aspect of the present application, the present application further provides a manufacturing method of an array substrate. The array substrate includes a substrate layer, a passivation layer, and a light filter layer that are sequentially stacked. The manufacturing method of the array substrate includes:

processing the concave-convex structure in the passivation layer of the array substrate.

Further, please refer to FIG. 6, FIG. 6 is a flow diagram of an embodiment of the manufacturing method of the array substrate of the present application, the manufacturing schematic diagram of each stage of the manufacturing method of the array substrate of the present application can be seen in FIG. 7 to FIG. 12. Processing the concave-convex structure 31 on the passivation layer 3 of the array substrate includes the following operations:

S100, depositing a flat passivation layer 3 on the substrate layer 2.

Figure 7:
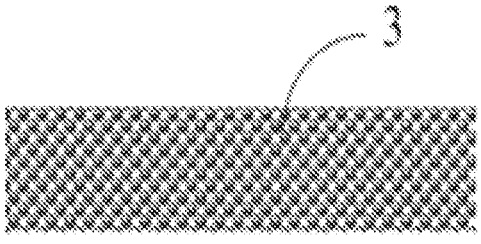
FIG. 7 is a schematic diagram of depositing a flat passivation layer on a substrate layer according to the manufacturing method of the array substrate.

According to FIG. 7, a passivation layer 3 (or an insulating film) may be deposited on the substrate layer 2 by chemical evaporation deposition. The material of the passivation layer 3 may include silicon nitride and silicon oxide.

S200, setting a photoresist layer 5 on the passivation layer 3.

Figure 8:
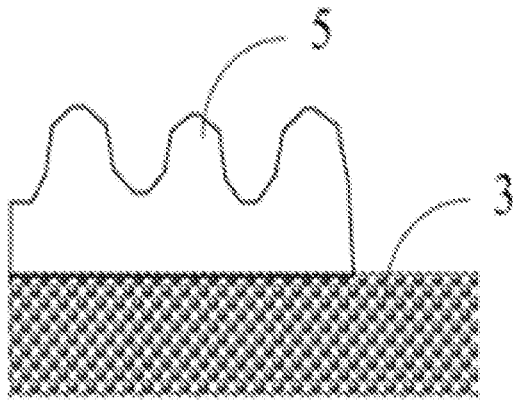
FIG. 8 is a schematic diagram of setting a photoresist layer on the passivation layer according to the manufacturing method of the array substrate.

According to FIG. 8, a layer of photoresist may be disposed on an upper surface of the passivation layer 3, and a half-tone mask may be disposed in an area where the concave-convex structure 31 needs to be generated, thereby facilitating adjustment of the height of the photoresist and forming of the concave-convex structure 31. The photoresist layer 5 may include a planarization layer connected to the passivation layer 3 and small protrusions spaced on the planarization layer.

S300, applying a first etching treatment on a position where the flat passivation layer 3 does not cover the photoresist layer 5.

Figure 9:
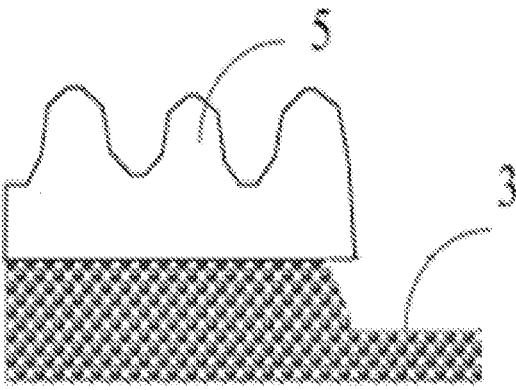
FIG. 9 is a schematic diagram showing a first etching treatment to a portion of the flat passivation layer uncovered by a photoresist layer according to the manufacturing method of the array substrate.

Referring to FIG. 9, through a first etching (to prevent excessive etching from affecting the other parts of the passivation layer 3, one part is firstly etched, and the other part is removed by a second etching), part of the excess part of the passivation layer 3 that is not covered with the photoresist layer 5 is removed, the first etching can be dry etching or wet etching.

S400, treating the photoresist layer 5 by a dry ashing method so that the photoresist layer 5 forms protrusions spaced from each other on the passivation layer 3.

Figure 10:
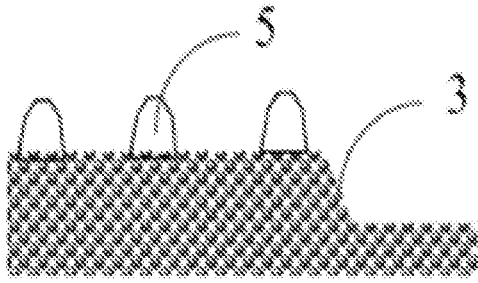
FIG. 10 is a schematic diagram showing a dry ashing treatment to the photoresist layer according to the manufacturing method of the array substrate.

According to the schematic diagram of FIG. 10, a part of the photoresist is removed by using a dry ashing process, so that the remaining photoresist forms spaced protrusions on the passivation layer 3, which facilitates the subsequent second etching treatment.

S500, applying a second etching treatment on the passivation layer 3.

Figure 11:
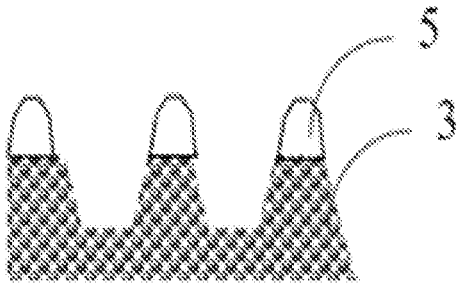
FIG. 11 is a schematic diagram of a second etching treatment to the passivation layer according to the manufacturing method of the array substrate.

According to FIG. 11, similar to the first etching, the concave-convex structure 31 can be etched on the passivation layer 3 by dry etching or wet etching. Of course, half etching is used instead of full etching, because the passivation layer 3 with the concave-convex structure 31 is needed to be remained.

S600, removing the remained photoresist layer 5 to obtain the passivation layer 3 having the concave-convex structure 31.

Figure 12:
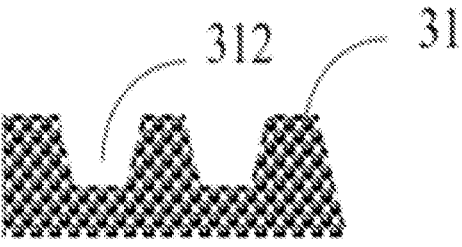
FIG. 12 is a schematic diagram showing that the photoresist layer is removed to form the passivation layer having the concave-convex structure according to a manufacturing method of an array substrate.

According to FIG. 12, the photoresist on the passivation layer 3 may be removed by wet demolding or dry ashing treatment to obtain the passivation layer 3 having the concave-convex structure 31.

In order to effectively improve transmittance of light, the smaller the size of the concave-convex structure 31, the better the transmittance of light. According to the above embodiment, a small-sized concave-convex structure 31 can be formed on the passivation layer 3, which is more advantageous to improve the light transmittance. In particular, by using the above method, the length of the bottom edge of the groove 312 and the distance between two adjacent grooves 312 can be less than 2 nm, and the height of the groove 312 can be limited by the maximum value. According to FIG. 2, the length of the bottom edge of the groove 312 is 0 μm to 2 μm, the distance between two adjacent grooves 312 is 0 μm to 2 μm, and the height of the groove 312 is less than one third of a maximum thickness of the passivation layer 3.

The above is only an optional embodiment of the present application, and does not limit the patent scope of the present application. Any equivalent structure or step transformation made by using the description of the present application and the accompanying drawings under the technical concept of the present application, or any direct or indirect application in other related technical fields, is included in the claimed scope of the present application.

What is claimed is:

1. An array substrate, comprising a substrate layer, a passivation layer and a light filter layer sequentially stacked, wherein one side of the passivation layer facing the light filter layer is provided with a concavo-convex structure;

the concavo-convex structure is formed by a plurality of grooves spaced at a bottom of the passivation layer, a cross section of each groove forms a trapezoid, a length of a bottom edge of each groove is 0 μm to 2 μm, a distance between two adjacent grooves is 0 μm to 2 μm, and a height of each groove is less than one third of a maximum thickness of the passivation layer.

2. The array substrate according to claim 1, wherein an inclination angle of a hypotenuse of the trapezoid is 30~60 degrees.

3. The array substrate according to claim 1, wherein a cross section of each groove is in an inverted triangular shape.

4. The array substrate according to claim 1, wherein a cross section of each groove is in an arc shape.

5. A display panel, comprising an encapsulation layer and an organic light-emitting diode (OLED) light-emitting layer and the array substrate according to claim 1, wherein the OLED light-emitting layer is disposed facing the array substrate, and the encapsulation layer is disposed on a side of the OLED light-emitting layer facing away from the array substrate.

6. A display device, wherein the display device comprises the display panel according to claim 5 and a backplane, and the display panel is disposed on the backplane.

7. An array substrate, comprising a substrate layer, a passivation layer and a light filter layer sequentially stacked, wherein the substrate layer comprises a substrate and a thin film transistor layer, the thin film transistor layer is disposed on the substrate, the passivation layer covers the substrate and the thin film transistor layer, and the light filter layer is disposed on the passivation layer and is staggered from the thin film transistor layer, a side of the passivation layer facing the light filter layer is provided with a concave-convex structure, and the concave-convex structure is formed by a plurality of grooves arranged at intervals at a bottom of the passivation layer, wherein a cross section of each groove forms a trapezoid, a length of a bottom edge of each groove is 0 μm to 2 μm, a distance between two adjacent grooves is 0 μm to 2 μm, and a height of each groove is less than one third of the maximum thickness of the passivation layer, the concavo-convex structure is configured to diffuse and diffract light rays incident on the passivation layer from the light filter layer.

8. The array substrate according to claim 7, wherein an inclination angle of a hypotenuse of the trapezoid is 30 to 60 degrees.

\* \* \* \* \*